United States Patent [19]

Tanabe et al.

[11] Patent Number: 4,461,042

[45] Date of Patent: Jul. 17, 1984

[54] TRANSISTOR BALANCED MIXER

[75] Inventors: Kenzo Tanabe; Junji Suzuki, both of Katano, Japan

[73] Assignee: Matsushita Electric Industrial Co., Ltd., Osaka, Japan

[21] Appl. No.: 310,365

[22] Filed: Oct. 9, 1981

[30] Foreign Application Priority Data

Oct. 13, 1980 [JP] Japan ................................ 55-143507

[51] Int. Cl.³ .............................................. H04B 1/16
[52] U.S. Cl. .................................... 455/333; 455/332
[58] Field of Search .............. 455/319, 323, 326, 333, 455/332; 332/43 B, 9 T, 16 T; 363/159

[56] References Cited

U.S. PATENT DOCUMENTS 4,216,431  8/1980  Shibata et al. ....................... 455/333
4,253,196  2/1981  Malchow ............................ 455/319
4,344,188  8/1982  Tanabe et al. ...................... 455/333

FOREIGN PATENT DOCUMENTS 53-39811  4/1978  Japan ................................... 455/333
54-100617 8/1979  Japan ................................... 455/333

Primary Examiner—Jin F. Ng
Attorney, Agent, or Firm—Wenderoth, Lind & Ponack

[57] ABSTRACT

A frequency mixer or converter which is applicable for use in superheterodyne radio frequency signal receivers and has good linearity characteristics as well as a low noise characteristic. The mixer utilizes a balanced transistor pair arrangement with an RC highpass filter but does not use a differential amplifier for amplifying the radio frequency signals. This results in a mixer having good low noise characteristics and good linearity as well as high attenuation of spurious intermediate frequency signals. In addition, the design is amenable to fabrication by integrated circuit technology.

4 Claims, 3 Drawing Figures

TRANSISTOR BALANCED MIXER

BACKGROUND OF THE INVENTION

This invention relates to a frequency mixer or converter which is applicable for superheterodyne type radio frequency signal receivers.

Generally, desired characteristics for a receiver mixer are as follows:
(i) low noise characteristics,
(ii) good linearity representing low cross-modulation distortion and intermodulation distortion,
(iii) large attenuation for intermediate frequency signals which are introduced at the input terminal of the mixer so as to realize stable receiver operation, and
(iv) low cost and small size.

The schottkey diode mixer and the transistor double balanced mixer are well known as high performance mixers in general. The schottkey diode mixer usually needs a plurality of expensive schottkey diodes and expensive peripheral circuits such as matching transformers. Also, it is difficult to realize a schottkey diode in a semiconductor integrated circuit chip using current low cost and stable semiconductor integration technologies. Accordingly, the production cost of the schottkey diode mixer is inherently very high.

On the other hand, many kinds of integrated transistor double balanced mixers are widely available in the marketplace. Part Number SL640C from Plessey Semiconductors is one of the examples. However, it is difficult to simultaneously realize both a low noise characteristic and a good linearity characteristic by using these kinds of mixers because of the following two problems.

The first problem is that it is difficult for the differential amplifier (for radio frequency amplification) included in these kinds of mixers to simultaneously realize both a low noise characteristic and a good linearity characteristic. The second problem is that signal switching transistors (for switching on and off the radio frequency signal supplied from said differential amplifier synchronously with the local frequency) included in these kinds of mixers are influenced by some noise sources having intermediate frequency components. One of the noise sources is another differential amplifier, also included in these kind of mixers, usually prepared as a buffer amplifier and a phase splitter for the local frequency signal which is obtained from a single ended local frequency oscillator.

SUMMARY OF THE INVENTION

An object of this invention is to provide a transistor mixer circuit which has good linearity characteristics and a low noise characteristic and is suitable for semiconductor integrated circuits.

Another object of this invention is to satisfy the aforementioned four desired characteristics for receiver mixers by utilizing a transistor balanced mixer which solves the two abovenoted problems.

The abovenoted two problems can be solved by the following ways:

Firstly, the transistor balanced mixer of this invention does not include a differential amplifier for radio frequency signals. Secondly, the transistor balanced mixer of this invention is provided with a high pass filter composed of a resistor and a capacitor to prevent the introduction of noise having intermediate frequency components generated by the differential amplifier used for supplying the local frequency signal to said signal switching transistors; the filter does not sacrifice the introduction of the local frequency signal from said differential amplifier used for supplying the local frequency signal to said signal switching transistors.

BRIEF DESCRIPTION OF THE DRAWINGS

Hereinafter, this invention will be described in detail in connection with the accompanying drawings in which.

DESCRIPTION OF THE PREFERRED EMBODIMENTS

Figure 1:
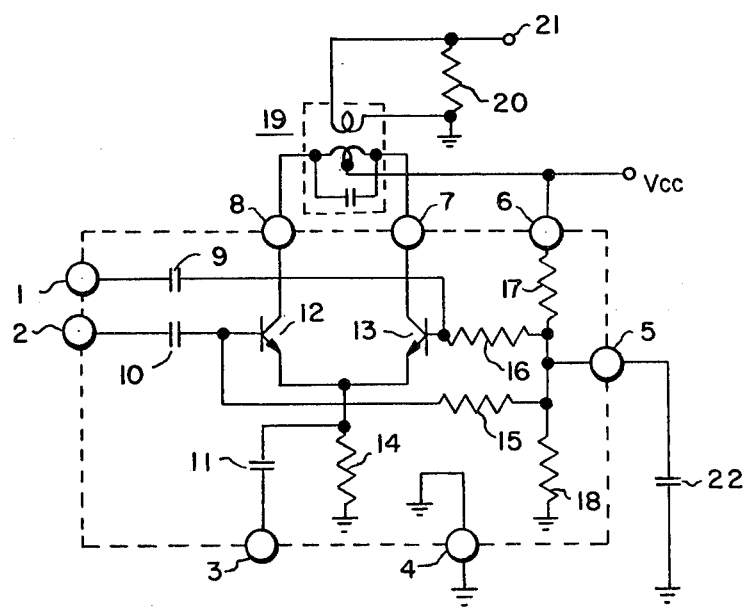
FIG. 1 is an embodiment of this invention designed for an integrated circuit.

FIG. 1 shows an embodiment of this invention designed for an integrated circuit. In FIG. 1, two phase split local frequency signals having opposite polarities are respectively supplied to the bases of a pair of transistors 13 and 12 through input terminals 1 and 2 and coupling capacitors 9 and 10. The emitters of transistors 12 and 13 are connected together in a common arrangement. Radio frequency signals are supplied to said common emitter through an input terminal 3 and a coupling capacitor 11. A base bias voltage source is composed of resistors 17 and 18 connected in series between a terminal 6 and ground, and a bypass capacitor 22 is connected through a terminal 5 to the common point of resistors 17 and 18. A DC power supply unit supplies a DC power voltage Vcc. The DC power voltage Vcc is supplied to the terminal 6 which is connected to one side of resistor 17. Said base bias voltage is respectively supplied to the bases of said pair of transistors 12 and 13 through base bias resistor 15 and 16. A frequency converted output signal is obtained from a secondary winding of a differential type intermediate frequency transformer 19. A primary winding of the differential type intermediate frequency transformer 19 is connected to the respective collectors of said pair of transistors 12 and 13 through terminals 8 and 7. A center tap of said primary winding of the differential type intermediate frequency transformer 19 is connected to said DC power supply unit. A resistor 20 is the output load resistor. An emitter bias resistor 14 is connected between the common emitter of said pair of transistors 12 and 13 and ground. A terminal 21 is used for outputting the frequency converted output signal. A terminal 4 is connected to ground.

Said pair of transistors 12 and 13 act as a common base amplifier for the radio frequency signal in a half period of the local frequency signal and as an insulator in another half period. This switching action, wherein transistors 12 and 13 are alternately switched on and off, is controlled by the local frequency signal. Accordingly, the frequency converted output signals having opposite polarities with respect to each other are obtained at the collectors of the pair of transistors 12 and 13.

On the other hand, the radio frequency signal components obtained at the collectors of the pair of transistors 12 and 13 have the same polarity, because each transistor 12 and 13 is supplied with the same radio frequency signal at its emitter terminal.

This kind of mixer is considered to be a balanced mixer for radio frequency signals. The main features of this mixer are as follows:

(1) It has good linearity characteristics because the common base amplifier which is the fundamental element of this mixer has inherently good linearity.

(2) It has a high attenuation characteristic for the intermediate frequency signal introduced at the input terminal because it is a balanced mixer.

(3) It has low noise characteristics because a differential amplifier for radio frequency signals is not included in this balanced mixer. As we have already described, the differential amplifier cannot have both the low noise and the good linearity characteristics at the same time.

It is desirable to design the values of resistance of the base bias resistors 15 and 16 so as to be as small as possible within the limits of the other circuit conditions. This is due to the fact that the thermal noise generated in the base bias resistors 15 and 16 degrades the low noise characteristics of this mixer.

(4) It is easily made in a integrated circuit comprising a part of a single semiconductor monolithic chip.

Figure 2:
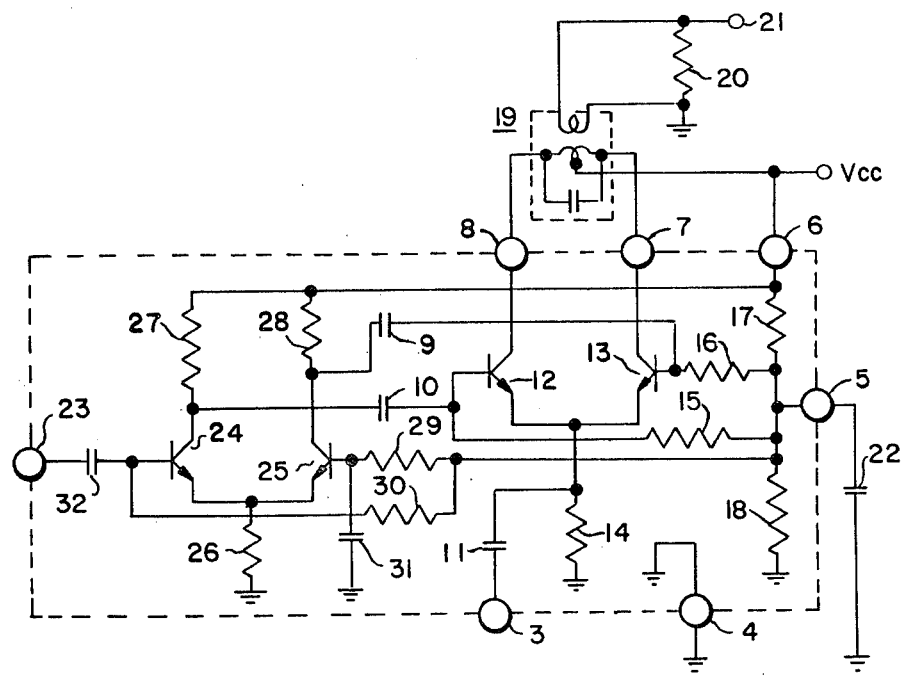
FIG. 2 and FIG. 3 show other embodiments of this invention.

FIG. 2 shows another embodiment of this invention. In this embodiment, a differential amplifier is provided as a means to generate the two phase split local frequency signals having opposite polarities from a single ended local frequency oscillator. In FIG. 2, the circuit components and terminals having the same numbers as in FIG. 1 have the same functions as those in FIG. 1. Accordingly, detailed descriptions of these circuit components and terminals are omitted here.

The differential amplifier for generating the two phase split local frequency signal is composed of transistors 24 and 25, an emitter bias resistor 26, collector bias and load resistors 27 and 28, base bias resistors 29 and 30, a base bypass capacitor 31 and a local frequency signal coupling capacitor 32. A signal from the single ended local frequency oscillator is supplied to a terminal 23. In this case, there is a noise source producing a noise having an intermediate frequency component. This noise degrades the low noise characteristics of the mixer. The noise source is the differential amplifier for the local frequency oscillator. It is therefore desirable to design the cutoff frequency of a RC type high pass filter composed of said collector bias resistors 27 and 28, said base bias resistors 15 and 16 and said local frequency signal coupling capacitors 9 and 10 to be nearly equal to the lower end of the local frequency, [when a variable frequency local oscillator is introduced] in order to attenuate noise having an intermediate frequency component at the base terminals of transistors 12 and 13.

Figure 3:
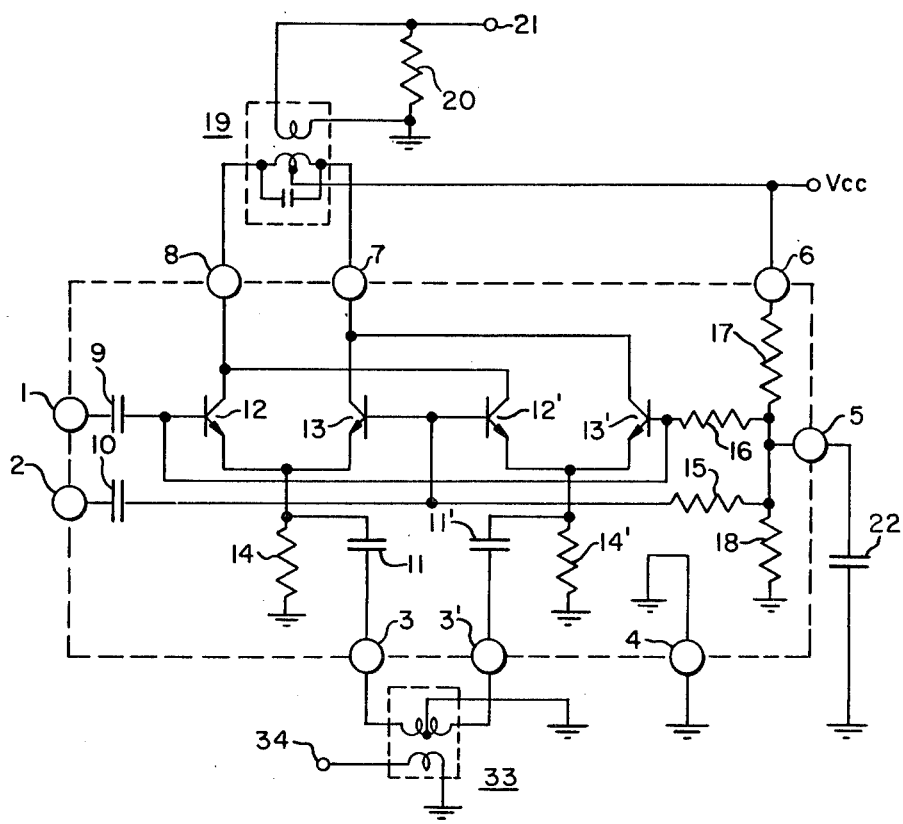

FIG. 3 shows another further embodiment of this invention having the double balanced configuration. In FIG. 3, the circuit components and terminals having the same numbers as in FIG. 1 and FIG. 2 have the same functions as in FIG. 1 and FIG. 2. Accordingly, detailed descriptions of these circuit components and terminals are omitted here.

A balun 33 is provided as a means to obtain the two phase split radio frequency signals from the radio frequency signal supplied to an input terminal 34. The further descriptions of this circuit are omitted, because it is easy to understand the circuit operation by this circuit diagram.

The mixers shown in FIG. 2 and FIG. 3 have the same features as those of the mixer shown in FIG. 1. In addition to the previously described features, the mixer in FIG. 2 is more easily applied to radio receiver, and the mixer in FIG. 3 is more suitable as a high performance mixer because of its inherent double balanced characteristics. As described in detail hereinabove, according to this invention, it is possible to realize a transistor balanced mixer which has good linearity characteristics with low noise and is suitable to inclusion in a semiconductor integrated circuit.

What is claimed is:

1. A transistor balanced mixer comprising: a pair of transistors whose emitters are connected together as a commoned emitter; an emitter bias resistor having one terminal which is connected to said commoned emitter and another terminal which is connected to ground; a base bias DC voltage source; a pair of base resistors, each of which is respectively connected between a base terminal of one of said pair of transistors and said base bias DC voltage source; a differential type intermediate frequency transformer which is connected between collector terminals of said pair of transistors, a center tap of a primary winding of said transformer being connected to a DC power supply unit; a radio frequency signal input terminal which is connected to said commoned emitter of said pair of transistors for receiving a radio frequency (RF) signal; and two local frequency signal terminals which are respectively connected to said base terminals of said pair of transistors for receiving two phase split local frequency signals having opposite polarities, said two signals being generated by an external source, whereby a frequency converted output signal is output at a terminal of a secondary winding of said intermediate frequency transformer.

2. A transistor balanced mixer as set forth in claim 1, wherein said two phase split local frequency signals are supplied through said respective local frequency signal terminals to said base terminals of said pair of transistors through a pair of coupling capacitors, a cutoff frequency of a RC type filter composed of said coupling capacitors and said base bias resistors being nearly equal to the lower end of the local frequency when said external source comprises a variable frequency external source.

3. A transistor balanced mixer comprising: a first pair of transistors composed of a first and a second transistor whose emitters are connected together as a first commoned emitter; a second pair of transistors composed of a third and a fourth transistor whose emitters are connected together as a second commoned emitter, wherein bases of said first transistor and of said fourth transistor are connected together as a first commoned base, and bases of said second transistor and of said third transistor are connected together as a second commoned base; a first and a second emitter bias resistor, said first emitter bias resistor being connected between said first commoned emitter and ground and said second emitter bias resistor being connected between said second commoned emitter and ground; a base bias DC voltage source; a first base bias resistor having one terminal which is connected to said first commoned base and having another terminal which is connected to said base bias DC voltage source; a second base bias resistor having one terminal which is connected to said second commoned base and having another terminal which is connected to said base bias DC voltage source; a differential type intermediate frequency transformer having one terminal of primary winding which is connected to collectors of said first and third transistors, and having another terminal of the primary winding which is connected to collectors of said second and fourth transistors, and having a center tap of the primary winding which is connected to a DC power supply unit; two radio frequency (RF) signal input terminals which are respectively connected to said first and second commoned emitters of said first and second pair of transistors for receiving two phase split radio frequency signals having opposite polarities; and two local frequency signal input terminals which are respectively connected to said first and second commoned bases for receiving two phase split local frequency signals having opposite polarities which are generated by an external source, whereby frequency converted output signals are output at terminals of a secondary winding of said intermediate frequency transformer.

4. A transistor balanced mixer as set forth in claim 3, wherein said two local frequency signal input terminals are respectively connected to said first and said second common bases through a pair of coupling capacitors, a cutoff frequency of a RC type filter composed of each of said coupling capacitors and each of said first and said second base resistors being nearly equal to the lower end of the local frequency when said external source comprises a variable frequency external source.

* * * * *